United States Patent
Muraki et al.

(10) Patent No.: US 11,177,113 B2
(45) Date of Patent: Nov. 16, 2021

(54) CHARGED PARTICLE BEAM APPARATUS AND CONTROL METHOD THEREOF

(71) Applicant: HITACHI HIGH-TECH SCIENCE CORPORATION, Tokyo (JP)

(72) Inventors: Ayana Muraki, Tokyo (JP); Tatsuya Asahata, Tokyo (JP); Atsushi Uemoto, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/820,852

(22) Filed: Mar. 17, 2020

(65) Prior Publication Data

US 2020/0312617 A1 Oct. 1, 2020

(30) Foreign Application Priority Data

Mar. 26, 2019 (JP) .............................. JP2019-057813

(51) Int. Cl.
*H01J 37/304* (2006.01)
*H01J 37/22* (2006.01)
*H01J 37/28* (2006.01)

(52) U.S. Cl.
CPC ........ *H01J 37/3045* (2013.01); *H01J 37/222* (2013.01); *H01J 37/28* (2013.01); *H01J 2237/30405* (2013.01)

(58) Field of Classification Search
CPC .......... H01J 37/222; H01J 37/10; H01J 37/21; H01J 37/244; H01J 37/00; H01J 37/02; H01J 37/28; H01J 37/3005; H01J 37/023; H01J 37/15; H01J 37/153; H01J 37/22; H01J 37/26; H01J 37/261; H01J 2237/304; H01J 2237/31745; H01J 2237/30466; H01J 2237/221; G01N 23/2251; G01N 2223/09; G01N 2223/102

USPC .......................................... 250/306, 307, 311
See application file for complete search history.

(56) References Cited

U.S. PATENT DOCUMENTS

| | | | |
|---|---|---|---|
| 2003/0173516 A1* | 9/2003 | Takane | H01J 37/28 250/310 |
| 2007/0158567 A1* | 7/2007 | Nakamura | H01J 37/28 250/311 |
| 2013/0026361 A1* | 1/2013 | Yamanashi | H01J 37/28 250/307 |

FOREIGN PATENT DOCUMENTS

JP      2006-313704 A      11/2006

* cited by examiner

*Primary Examiner* — Jason L McCormack
(74) *Attorney, Agent, or Firm* — Holland & Hart LLP

(57) ABSTRACT

Automated processing is provided. A charged particle beam apparatus includes: an image identity degree determination unit determining whether an identity degree is equal to or greater than a predetermined value, the identity degree indicating a degree of identity between a processing cross-section image that is an SEM image obtained through observation of a cross section of the sample by a scanning electron microscope, and a criterion image that is the processing cross-section image previously registered; and a post-determination processing unit performing a predetermined processing operation according to a result of the determination by the image identity degree determination unit.

10 Claims, 3 Drawing Sheets

CHARGED PARTICLE BEAM APPARATUS AND CONTROL METHOD THEREOF

CROSS REFERENCE TO RELATED APPLICATION(S)

This application claims the benefit of Japanese Patent Application No. 2019-057813, filed Mar. 26, 2019, which is hereby incorporated by reference in its entirety into this application.

BACKGROUND OF THE INVENTION

1. Technical Field

The present invention relates to a charged particle beam apparatus and a control method thereof.

2. Description of the Related Art

In preparation of a lamella sample, by using a focused ion beam (FIB), a surface of a sample is processed to form a cross section thereof, and a process of forming the cross section is observed using a scanning electron microscope (SEM) or the FIB. An operator observes a scan image obtained by the SEM to detect that a particular structure appears on the cross section of the sample or that the sample has an appropriate thickness, and terminates the processing by the FIB.

In order for the operator to detect the appearance of the particular structure, it is necessary to acquire an image with high resolution through reduction in noise by scanning at low speed, or through use of a lens mode with high resolution.

In the related art, a focused ion beam apparatus that selects an optical condition and observes a sample to calculate a processing condition is well known (see patent document 1). In the focused ion beam apparatus according to the related art, when an operator inputs input data (a size or depth of a processing region, a type of sample, a dose), the optical condition is selected and the processing condition on the sample with respect to the focused beam is automatically calculated according to the selected optical condition. Even in the focused ion beam apparatus according to the related art, when the operator tries to input appropriate input data, it is necessary to detect that the particular structure appears on the cross section of the sample.

DOCUMENT OF RELATED ART (Patent Document 1) Japanese Patent Application Publication No. 2006-313704

SUMMARY OF THE INVENTION

However, in order for the operator to detect the particular structure, the operator needs to be skilled enough to be capable of determining the particular structure. Further, it takes time to identify an image of the sample. Therefore, in a charged particle beam apparatus using the FIB, or the like, automated processing is required.

Accordingly, the present invention has been made keeping in mind the above problems, and the present invention proposes a charged particle beam apparatus and a control method thereof, the charged particle beam apparatus being capable of automating processing.

In order to solve the problem and to achieve the objective, the present invention adopts the following aspects.

(1) According to one aspect of the present invention, there is provided a charged particle beam apparatus including: an image identity degree determination unit determining whether an identity degree is equal to or greater than a predetermined value, the identity degree indicating a degree of identity between a processing cross-section image that is an SEM image obtained through observation of a cross section of the sample by a scanning electron microscope, and a criterion image that is the processing cross-section image previously registered; and a post-determination processing unit performing a predetermined processing operation according to a result of the determination by the image identity degree determination unit.

In the charged particle beam apparatus according to the aspect described in (1) above, when the criterion image is registered in advance, a particular structure appearing at a processing end is automatically detected, whereby processing may be automated.

(2) The charged particle beam apparatus described in (1) above may further include: a registration image determination unit determining, based on the processing cross-section image, whether a particular structure appears on the cross section, in a period before the image identity degree determination unit performs the determination; and an image registration unit registering the processing cross-section image as the criterion image when the registration image determination unit determines that the particular structure appears on the cross section, in the period.

In the charged particle beam apparatus according to the aspect described in (2) above, since the processing cross-section image in which it is determined that the particular structure appears in the middle of processing of the sample is registered as the criterion image, precision of the processing operation in which whether the processing cross-section image is identical to the criterion image is determined is increased, compared to a case of using, as the criterion image, a predetermined SEM image of a particular periodic structure appearing at the processing end by using a sample other that a sample which is an object to be processed.

(3) In the charged particle beam apparatus described in (2) above, the registration image determination unit may use, as the processing cross-section image, the SEM image for the determination which is obtained through observation by the scanning electron microscope with use of a first mode, in the period; the image registration unit may register, as the criterion image, the processing cross-section image obtained through observation of the cross section by the scanning electron microscope with use of a second mode having resolution lower that resolution of the first mode, when the registration image determination unit determines that the particular structure appears on the cross section, in the period; and the image identity degree determination unit may use, as the processing cross-section image, the SEM image for the determination which is obtained through observation by the scanning electron microscope with use of the second mode.

In the charged particle beam apparatus according to the aspect described in (3) above, the second mode having the resolution lower than normal resolution that is the resolution of the first mode is used to determine whether the particular structure appearing at the processing end appears, whereby a processing time may be shortened.

Herein, acquiring a high-resolution image takes longer than acquiring a normal-resolution image, resulting in a longer processing time. For example, a low speed scan takes a scan time longer compared to a normal scan. Further, when a lens mode with high resolution is used, it takes time to switch to a normal lens mode.

(4) In the charged particle beam apparatus described in (2) or (3) above, the criterion image may be a plurality of the processing cross-section images, and the image registration unit may register the processing cross-section image as the criterion image each time the registration image determination unit determines that the particular structure appears on the cross section, in the period.

In the charged particle beam apparatus according to the aspect described in (4) above, the precision of the processing operation in which whether the processing cross-section image is identical to the criterion image is determined may be increased, compared to a case where the criterion image is one processing cross-section image.

(5) In the charged particle beam apparatus described in any one of (1) to (4) above, the criterion image may be the SEM image in which the particular structure is taken, and the predetermined processing operation may be a processing operation in which a predetermined analysis is conducted.

In the charged particle beam apparatus according to the aspect described in (5) above, the processing operation may be performed in which a predetermined analysis is conducted on the cross section of the sample S on which the particular structure appears.

(6) According to one aspect of the present invention, there is provided a control method of a charged particle beam apparatus that processes a sample by emitting a charged particle beam toward the sample, the control method including: an image identity degree determination process of determining whether an identity degree is equal to or greater than a predetermined value, the identity degree indicating a degree of identity between a processing cross-section image that is an SEM image obtained through observation of a cross section of the sample by a scanning electron microscope, and a criterion image that is the processing cross-section image previously registered; and a post-determination processing operation process of performing a predetermined processing operation according to a result of the determination in the image identity degree determination process.

According to the charged particle beam apparatus of the present invention, processing can be automated. Further, according to the charged particle beam apparatus of the present invention, processing time can be shortened.

BRIEF DESCRIPTION OF THE DRAWINGS

The above and other objectives, features, and advantages of the present invention will be more clearly understood from the following detailed description taken in conjunction with the accompanying drawings, in which.

DESCRIPTION OF THE PREFERRED EMBODIMENTS

Hereinafter, a charged particle beam apparatus according to an embodiment of the present invention will be described with reference to the accompanying drawings.

Figure 1:
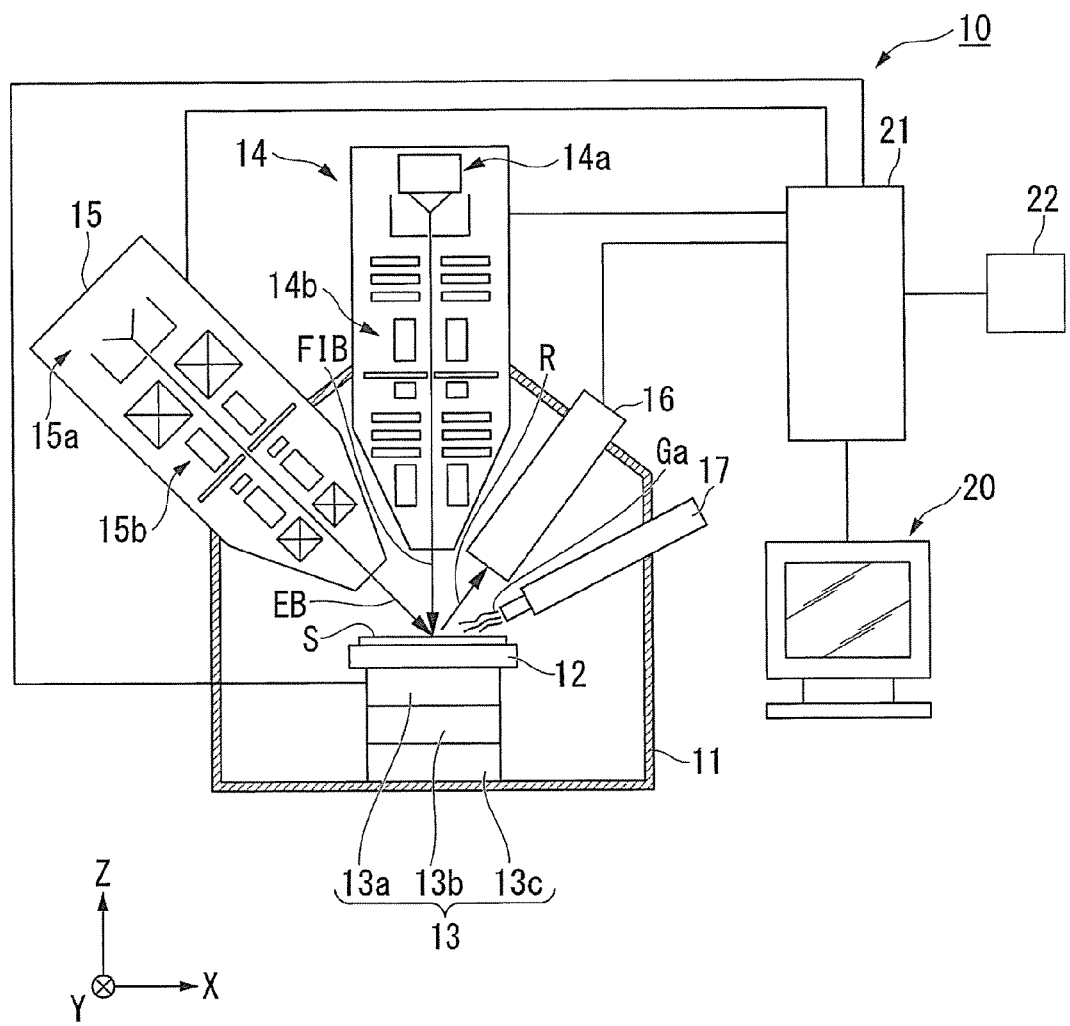
FIG. 1 is a diagram illustrating an example of a configuration of a charged particle beam apparatus according to an embodiment of the present invention.

FIG. 1 is a diagram illustrating an example of a configuration of a charged particle beam apparatus 10 according to the present embodiment. The charged particle beam apparatus 10 is an apparatus that processes a sample S by emitting a charged particle beam toward the sample S.

The charged particle beam apparatus 10 includes a sample chamber 11, a stage 12, a driving unit 13, a focused ion beam column 14, an electron beam column 15, a detector 16, a gas supply unit 17, a display device 20, a control device 21, and an input device 22.

The sample chamber 11 is a place where a sample S is placed and is capable of maintaining the inside of the sample chamber to be in a vacuum state. The stage 12 fixes the sample S inside the sample chamber 11.

The driving unit 13 drives the stage 12. The driving unit 13 is received inside the sample chamber 11 while being in contact with the stage 12, and displaces the stage 12 with respect to a predetermined axis according to a control signal output from the control device 21. The driving unit 13 includes a moving unit 13a that moves the stage 12 along an X axis and a Y axis parallel which are perpendicular to each other and are parallel to the horizontal plane, and along a Z axis parallel which is in a vertical direction perpendicular to the X axis and the Y axis. The driving unit 13 includes a tilt unit 13b rotating the stage 12 around the X axis or Y axis, and includes a rotation unit 13c rotating the stage 12 around the Z axis.

The focused ion beam column 14 emits a focused ion beam (FIB) to an object to be irradiated which is within a predetermined irradiation region (namely, a scan range) inside the sample chamber 11.

The focused ion beam column 14 causes, inside the sample chamber 11, a beam emitting portion (not shown) to face the stage 12 at a position vertically above the stage 12 within the irradiation region, and is fixed to the sample chamber 11 with the optical axis parallel to the vertical direction. As a result, the focused ion beam column 14 is capable of emitting the focused ion beam downward in the vertical direction above the object to be irradiated, such as the sample S, or the like, fixed on the stage 12. Herein, the focused ion beam column 14 may be fixed to the sample chamber 11 with the optical axis parallel to a direction inclined with respect to the vertical direction.

The focused ion beam column 14 includes an ion source 14a generating ions and ion optics 14b focusing and deflecting the ions extracted from the ion source 14a. The ion source 14a is an ion source such as a liquid metal ion source, a plasma ion source, a gas field ion source, or the like. The ion source 14a and the ion optics 14b are controlled according to the control signal output from the control device 21, and an irradiation position, an irradiation condition, and the like of the focused ion beam are controlled by the control device 21. The ion optics 14b includes, for example, a first electrostatic lens, such as, a condenser lens, or the like; an electrostatic deflector; and a second electrostatic lens, such as an objective lens.

The electron beam column 15 emits an electron beam (EB) to the object to be irradiated within the predetermined irradiation region inside the sample chamber 11. The electron beam column 15 includes a secondary charged particle detector (not shown) that detects secondary charged particles (back-scattered electrons) generated from the object to be irradiated due to irradiation with the electron beam inside the electron beam column 15.

The electron beam column 15 includes an electron source 15a generating electrons, and electron optics 15b focusing and deflecting the electrons emitted from the electron source 15a. The electron source 15a and the electron optics 15b are controlled according to the control signal output from the control device 21, and an irradiation position, an irradiation condition, and the like of the electron beam are controlled by the control device 21. The electron optics 15b includes, for example, an electron lens, a deflector, or the like.

The detector 16 detects secondary charged particles R (secondary electrons, secondary ions, or the like) generated from the object to be irradiated due to irradiation with the focused ion beam or electron beam. The gas supply unit 17 supplies gas Ga to the surface of the object to be irradiated.

The electron beam column 15 and the detector 16 constitute a scanning electron microscope 30.

The charged particle beam apparatus 10 performs a variety of processing (etching processing, and the like) with sputtering and formation of a deposition film by scanning and irradiating the surface of the object to be irradiated with the focused ion beam. The charged particle beam apparatus 10 may perform processing for forming a cross section for cross-section observation on the sample S by using the scanning electron microscope 30, or the like, and may perform processing for forming a sample piece (for example, a lamella sample, a needle-shaped sample, or the like) for transmission observation from the sample S by using a transmission electron microscope. The charged particle beam apparatus 10 performs observation of the surface of the object to be irradiated by scanning and irradiating the surface of the object to be irradiated, such as the sample S, or the like, with the focused ion beam or electron beam.

The display device 20 displays image data, or the like based on the secondary charged particles detected by the detector 16 or the detector inside the electron beam column 15.

The input device 22 receives a variety of operations from the operator of the charged particle beam apparatus 10. The input device 22 is, for example, a mouse and a keyboard outputting a signal in response to an input operation of the operator.

The control device 21 controls the driving unit 13, the focused ion beam column 14, and the electron beam column 15 based on a processing cross-section image SI that is an SEM image obtained by observing the cross section of the sample S with use of the scanning electron microscope 30. Further, the control device 21 controls the driving unit 13, the focused ion beam column 14, and the electron beam column 15 based on the operation from the input device 22.

The control device 21 is, for example, a personal computer (PC).

Figure 2:
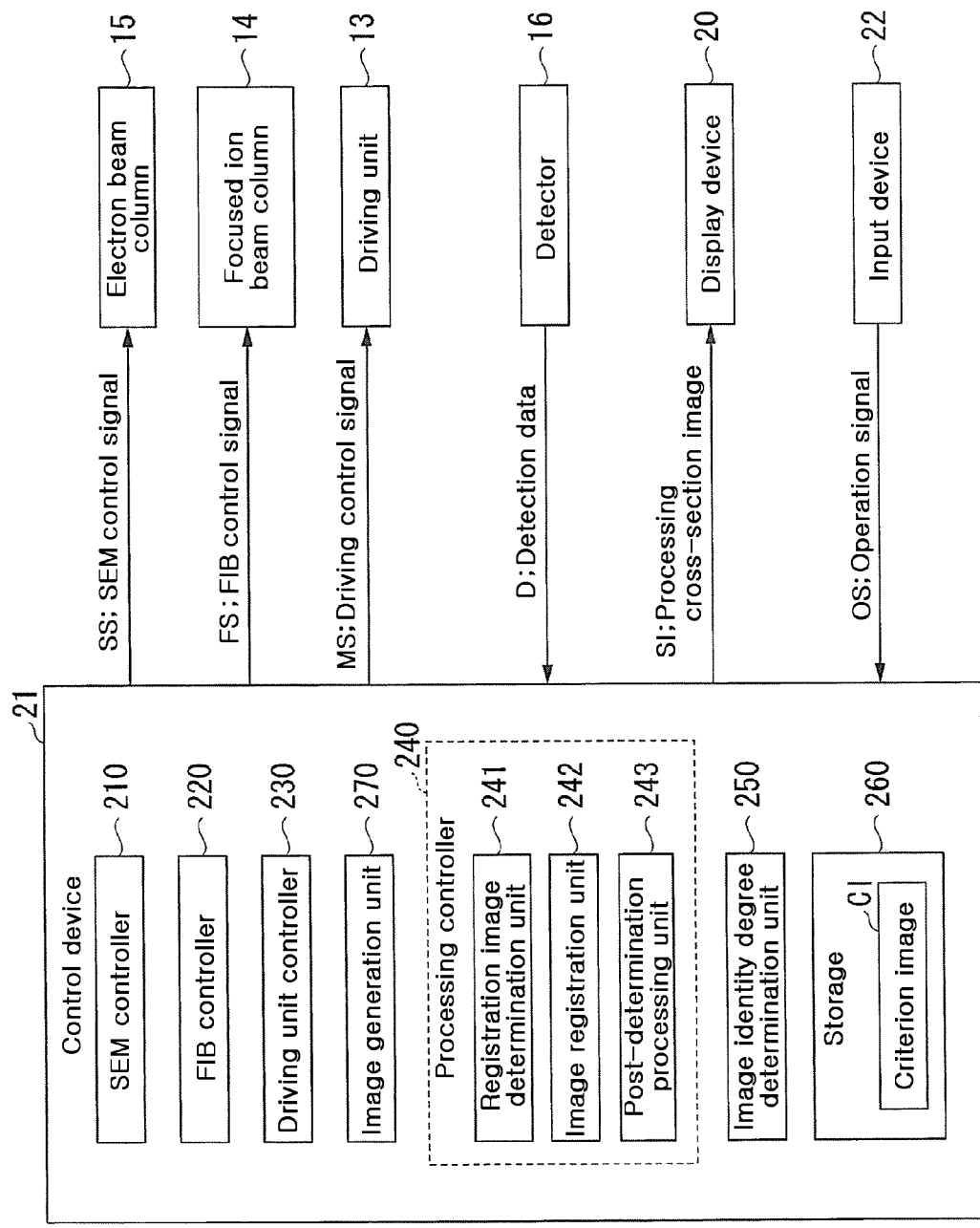
FIG. 2 is a diagram illustrating an example of a configuration of a control device according to an embodiment of the present invention.

Herein, referring to FIG. 2, a configuration of the control device 21 will be described. FIG. 2 is a diagram illustrating an example of the configuration of the control device 21 according to the present embodiment. The control device 21 is displaced outside the sample chamber 11. The driving unit 13, the focused ion beam column 14, the electron beam column 15, the detector 16, the display device 20, and the input device 22 are connected to the control device 21.

The control device 21 integrally controls the operation of the charged particle beam apparatus 10 by an operation signal OS output from the input device 22, a signal generated by preset automatic operation control processing, or the like.

The control device 21 includes an SEM controller 210, an FIB controller 220, a driving unit controller 230, a processing controller 240, an image identity degree determination unit 250, a storage 260, and an image generation unit 270. The SEM controller 210, the FIB controller 220, the driving unit controller 230, the processing controller 240, the image identity degree determination unit 250, and the image generation unit 270 are modules implemented by a CPU of the control device 21 which reads and performs a processing operation.

The SEM controller 210 controls the electron beam column 15 by outputting an SEM control signal SS to the electron beam column 15. The SEM control signal SS is, for example, a signal for switching an observation mode M of the scanning electron microscope 30. The observation mode M includes a first mode M1 and a second mode M2 in which resolution is lower than that of the first mode M1.

In the present embodiment, the observation mode M corresponds to, for example, a scan speed. The first mode M1 is a mode in which scanning is performed at a speed lower than a normal speed. The second mode M2 is a mode in which scanning is performed at a normal speed. In the first mode M1, scanning is performed at the speed lower than that of the second mode M2, and thus the SEM image with resolution higher than that of the second mode M2 is obtained.

Further, the observation mode M may correspond to a lens mode indicating the optical condition of the electron optics 15b. When the observation mode M corresponds to the lens mode, the first mode M1 is a high-resolution mode having resolution higher than that of a normal mode. The second mode M2 is the normal mode having resolution lower than that of the high-resolution mode.

The FIB controller 220 controls the focused ion beam column 14 by outputting an FIB control signal FS to the focused ion beam column 14. The FIB control signal FS is, for example, a signal for setting the irradiation position, the irradiation condition, and the like of the focused ion beam.

The driving unit controller 230 controls the driving unit 13 by outputting a driving control signal MS to the driving unit 13. The driving control signal MS is a signal for displacing the stage 12 with respect to a predetermined axis.

The image generation unit 270 acquires detection data D supplied from the detector 16. The detection data D is data indicating the amount of secondary charged particles detected by the detector 16 while the irradiation position for the charged particle beam is scanned.

The image generation unit 270 converts, based on the detection data D, the amount of the detected secondary charged particles into a luminance signal corresponding to the irradiation position, and generates image data representing the shape of the cross section of the sample S based on two-dimensional position distribution of the amount of the detected secondary charged particles. The image data may contain the processing cross-section image SI. The image generation unit 270 causes the processing cross-section image SI to be displayed on the display device 20.

The image generation unit 270 causes each piece of the generated image data and a screen for performing operations, such as zoom-in, zoom-out, translation, rotation, and the like of each piece of the image data, to be simultaneously displayed on the display device 20. Further, the image generation unit 270 causes a screen for performing a variety of setting operations, such as processing setting, and the like, to be displayed on the display device 20.

The processing controller 240 performs a processing operation based on the processing cross-section image SI. The processing controller 240 includes a registration image determination unit 241, an image registration unit 242, and a post-determination processing unit 243.

The registration image determination unit 241 determines, based on the processing cross-section image SI, whether a particular structure appears on the cross section of the sample S. Herein, the particular structure is, for example, a structure that characterizes a processing end.

The image registration unit 242 registers, as a criterion image CI, the processing cross-section image SI in which the registration image determination unit 241 determines that the particular structure appears on the cross section of the sample S. Herein, the image registration unit 242 stores the processing cross-section image SI as the criterion image CI in the storage 260, thereby registering the processing cross-section image SI.

The post-determination processing unit 243 performs a predetermined processing operation according to a result of the determination by the image identity degree determination unit 250. Herein, the predetermined processing operation is, for example, a processing operation for terminating the processing of the sample S.

The image identity degree determination unit 250 determines whether an identity degree indicating a degree of identity between the processing cross-section image SI and the criterion image CI which is a previously registered processing cross-section image SI, is equal to or greater than a predetermined value. Further, the predetermined value may be arbitrarily set.

The storage 260 stores the criterion image CI. The storage 260 is a storage device, for example, a random access memory (RAM), a hard disk drive (HDD), flash memory, or the like. Further, the storage 260 may be provided outside the charged particle beam apparatus 10. In the case where the storage 260 is provided outside the charged particle beam apparatus 10, for example, the storage 260 is provided as a cloud server with which the control device 21 performs communication.

Further, at least one among the processing controller 240 and the image identity degree determination unit 250 may be provided outside the charged particle beam apparatus 10. When the processing controller 240 and the image identity degree determination unit 250 are provided outside the charged particle beam apparatus 10, the processing controller 240 and the image identity degree determination unit 250 are implemented each, for example, as an application installed in a PC separate from the control device 21 or an application provided in a cloud server.

Figure 3:
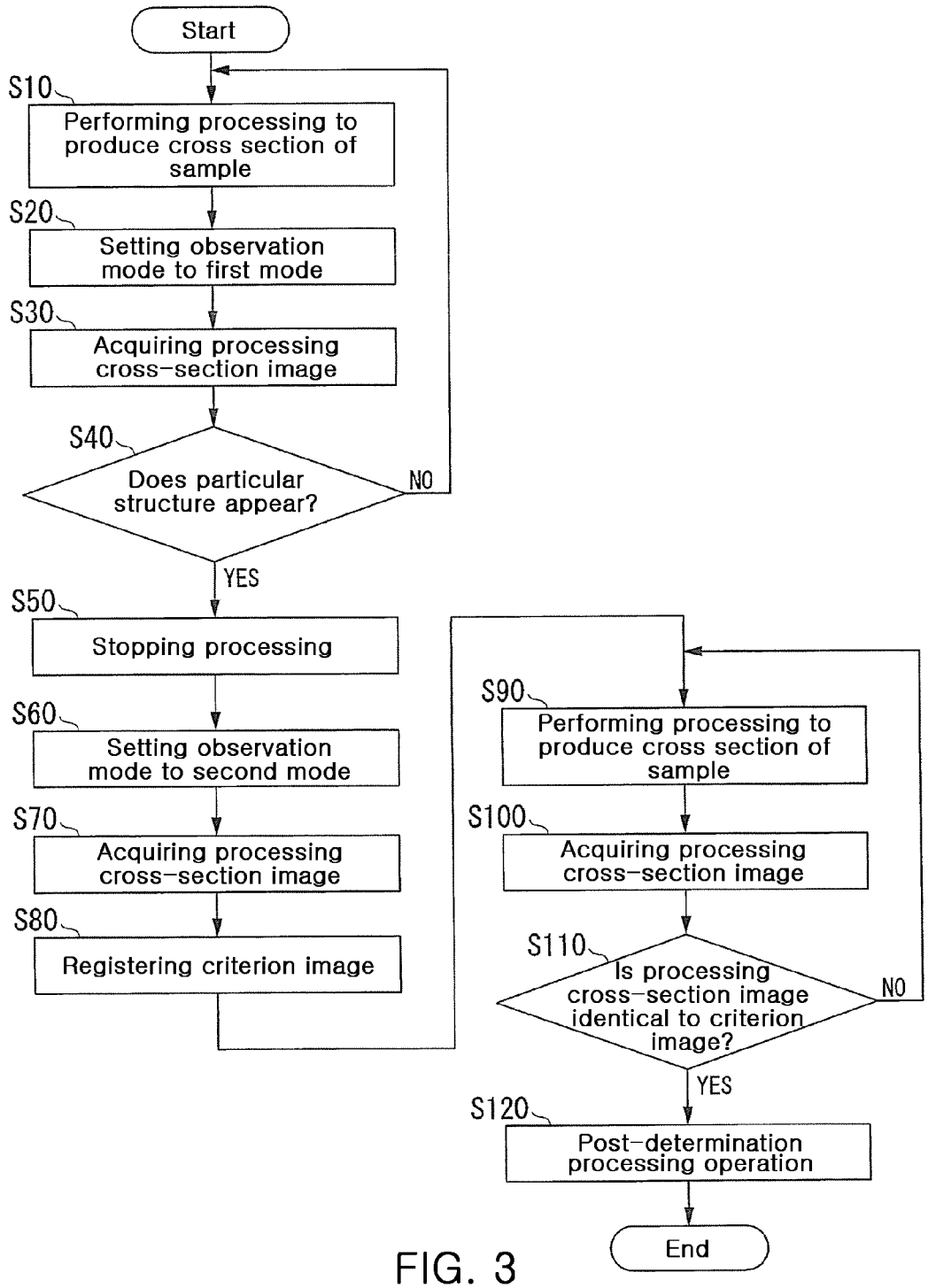
FIG. 3 is a diagram illustrating an example of a lamella sample production processing operation according to an embodiment of the present invention.

Next, referring to FIG. 3, a process in which the charged particle beam apparatus 10 produces a lamella sample from the sample S will be described. FIG. 3 is a diagram illustrating an example of a lamella sample production processing operation according to the present embodiment.

Step S10: the FIB controller 220 performs processing on the surface of the sample S, so that the cross section of the sample S is produced. Herein, the FIB controller 220 outputs the FIB control signal FS to the focused ion beam column 14 so that the focused ion beam column 14 emits the focused ion beam to irradiate the sample S.

Step S20: the SEM controller 210 sets the observation mode M to the first mode M1. Since the observation mode M is set to the first mode M1, the scan speed is set to the low speed.

Step S30: the registration image determination unit 241 acquires a processing cross-section image SI1 generated by the image generation unit 270. Herein, the processing cross-section image SI1 is an SEM image based on a result of observing the cross section of the sample S by the scanning electron microscope 30 in the first mode M1.

Step S40: the registration image determination unit 241 determines whether a particular structure appears in the processing cross-section image SI1 acquired at step S30. When the registration image determination unit 241 determines that the particular structure appears in the processing cross-section image SI1 at step S40 (YES), the control device 21 performs a processing operation of step S50. However, when the registration image determination unit 241 determines that the particular structure does not appear in the processing cross-section image SI1 at step S40 (NO), the control device 21 performs the processing operation of step S10 again.

Herein, the step S40 corresponds to a period before the image identity degree determination unit 250 performs the determination. That is, the registration image determination unit 241 determines, based on the processing cross-section image SI1, whether the particular structure appears on the cross section of the sample S, in the period before the image identity degree determination unit 250 performs the determination.

Further, the processing cross-section image SI1 is an SEM image obtained through observation by the scanning electron microscope 30 with use of the first mode M1, in the period before the image identity degree determination unit 250 performs the determination. That is, the registration image determination unit 241 uses the processing cross-section image SI for determination, which is the SEM image obtained through observation by the scanning electron microscope 30 with use of the first mode M1, in the period before the image identity degree determination unit 250 performs the determination.

Step S50: the FIB controller 220 stops the processing.

Step S60: the SEM controller 210 sets the observation mode M to the second mode M2. Since the observation mode M is set to the second mode M2, the scan speed is set to the normal speed.

Step S70: the registration image determination unit 241 acquires a processing cross-section image SI2 generated by the image generation unit 270. Herein, the processing cross-section image SI2 is an SEM image based on a result of observing the cross section of the sample S in the second mode M2.

Step S80: the image registration unit 242 registers the processing cross-section image SI2 as the criterion image CI. Herein, the image registration unit 242 stores the processing cross-section image SI2 as the criterion image CI in the storage 260.

Herein, the step S80 corresponds to a period before the image identity degree determination unit 250 performs the determination. That is, the image registration unit 242 registers the processing cross-section image SI2 as the criterion image CI when the registration image determination unit 241 determines that the particular structure appears on the cross section of the sample S, in the period before the image identity degree determination unit 250 performs the determination.

Further, the processing cross-section image SI2 is the processing cross-section image SI obtained through observation of the cross section of the sample S by the scanning electron microscope 30 with use of the second mode M2 having resolution lower than that of the first mode M1. That is, when the registration image determination unit 241 determines that the particular structure appears on the cross section of the sample S, in the period before the image identity degree determination unit 250 performs the determination, the image registration unit 242 registers, as the criterion image CI, the processing cross-section image SI2 obtained through observation of the cross section by using the scanning electron microscope 30 with use of the second mode M2 having resolution lower than that of the first mode M1.

Step S90: the FIB controller 220 produces the cross section of the sample S. Herein, the FIB controller 220 outputs the FIB control signal FS to the focused ion beam column 14 so that the focused ion beam column 14 emits the focused ion beam to irradiate the sample S.

Step S100: the registration image determination unit 241 acquires a processing cross-section image SI2 generated by the image generation unit 270. Herein, the processing cross-section image SI2 is an SEM image based on a result of observing the cross section of the sample S by the scanning electron microscope 30 in the second mode M2.

Step S110: the image identity degree determination unit 250 determines whether the processing cross-section image SI2 is identical to the criterion image CI. Herein, the image identity degree determination unit 250 determines that the processing cross-section image SI2 is identical to the criterion image CI, when the identity degree indicating the degree of identity between the processing cross-section image SI2 and the criterion image CI is equal to or greater than the predetermined value.

The image identity degree determination unit 250 performs the determination using a known algorithm for determining an identity degree of an image.

Herein, the processing cross-section image SI2 is an SEM image obtained through observation by the scanning electron microscope 30 with use of the second mode M2. That is, the image identity degree determination unit 250 uses the processing cross-section image SI2 for the determination, which is the SEM image obtained through observation by the scanning electron microscope 30 with use of the second mode M2.

When the image identity degree determination unit 250 determines that the processing cross-section image SI2 is identical to the criterion image CI at step S110 (YES), the control device 21 performs a processing operation of step S120. However, when the image identity degree determination unit 250 determines that the processing cross-section image SI2 is not identical to the criterion image CI at step S110 (NO), the control device 21 performs the processing operation of step S90 again.

Step S120: the post-determination processing unit 243 performs a post-determination processing operation. The post-determination processing unit 243 causes the FIB controller 220 to terminate, for example, the processing of the sample S, as the post-determination processing operation.

Afterward, the control device 21 terminates the lamella sample production processing operation.

Further, the post-determination processing unit 243 may perform, as the post-determination processing operation, a processing operation in which processing continues until it is determined a predetermined number of times that the processing cross-section image SI2 is identical to the criterion image CI. In this case, the post-determination processing unit 243 causes the control device 21 to repeat the processing operations of steps S90, S100, and S110 until it is determined the predetermined number of times that the images are identical at step S110.

Further, the post-determination processing unit 243 may perform an analysis processing operation as the post-determination processing operation. The analysis processing operation is a predetermined analysis conducted on the sample S, for example, energy dispersive x-ray spectrometry (EDS). The criterion image CI is the processing cross-section image SI registered when the particular structure appears on the cross section of the sample S at step S40, and the post-determination processing operation is performed when the processing cross-section image SI is identical to the criterion image CI at step S110, and thus the analysis processing operation is performed on the cross section of the sample S on which the particular structure appears.

That is, the criterion image CI is the SEM image in which the particular structure is taken, and the post-determination processing operation is the processing operation in which a predetermined analysis is conducted.

Further, regarding the lamella sample production processing operation shown in FIG. 3, the case where the scan speed is set for the observation mode M has been described, but the present invention is not limited thereto. As the observation mode M, the lens mode may be set.

Further, for the observation mode M, magnification of the electron optics 15b of the electron beam column 15 may be set. When the magnification of the electron optics 15b is set for the observation mode M, the first mode M1 corresponds to high magnification. The second mode M2 corresponds to low magnification. Although the processing time does not change with the magnification of the electron optics 15b, the sample S is observed at low magnification of the second mode M2, thereby reducing damage to the sample S which is accompanied by irradiation with the EB.

Further, in the present embodiment, the case where one processing cross-section image SI is registered as the criterion image CI has been described, but the present invention is not limited thereto. The criterion image CI may be a plurality of the processing cross-section images SI.

In the case where the criterion image CI is a plurality of the processing cross-section images SI, regarding the lamella sample production processing operation shown in FIG. 3, the control device 21 repeats the processing operations at steps S10 to S40 until the processing cross-section images SI in which the particular structures appear are obtained as many as a predetermined number. Herein, the image registration unit 242 registers the processing cross-section image SI1 as the criterion image CI each time the registration image determination unit 241 determines that the particular structure appears on the cross section of the sample S, in the period before the image identity degree determination unit 250 performs the determination.

Compared to the case where one processing cross-section image SI is used as a criterion image CI, in the case where the criterion image CI is a plurality of the processing cross-section images SI, the precision of the processing operation in which whether the processing cross-section image SI2 is identical to the criterion image CI is determined at step S110 may be increased.

Further, the sample S has a periodic structure, and the number of times that the image identity degree determination unit 250 determines that the processing cross-section image SI2 is identical to the criterion image CI is counted, whereby the thickness of the sample S in the middle of processing may be calculated. The control device 21 may execute the step S120, when the thickness of the sample S is calculated and it is determined that the sample S has an appropriate thickness at step S110 in FIG. 3.

Further, as a criterion image CI, a predetermined SEM image in which the particular structure appearing at the processing end is taken, may be stored in the storage 260 in advance of the start of the processing. In the case where the criterion image CI is stored in the storage 260 in advance of the start of the processing, the registration image determination unit 241 and the image registration unit 242 may be omitted from the configuration of the control device 21.

As described above, in the charged particle beam apparatus 10 according to the present embodiment, once the criterion image CI is registered, the particular structure that appears at the processing end is automatically detected, whereby processing can be automated.

Further, in the charged particle beam apparatus 10 according to the present embodiment, the second mode M2 having resolution lower than the normal resolution in the first mode M1 is used to determine whether the particular structure appearing at the processing end appears, whereby the processing time can be shortened.

Further, a part of the control device 21 of the charged particle beam apparatus 10 according to the above-described embodiment, for example, the processing controller 240 and the image identity degree determination unit 250 may be implemented by a computer. In this case, this configuration may be implemented by recording a program for enabling such control functions on a computer-readable recording medium and causing a computer system to read the program recorded on the recording medium for execution. Further, it is noted that the "computer system" herein refers to a computer system built into the charged particle beam apparatus 10 and includes an OS or hardware, such as a peripheral device, or the like. Furthermore, the "computer-readable recording medium" refers to a portable medium such as a flexible disk, a magneto-optical disk, a ROM, a CD-ROM, or the like; or a storage device such as a hard disk built in to the computer system, or the like. Moreover, the "computer-readable recording medium" may include a medium for dynamically holding a program for a short period of time, such as a communication line that is used to transmit the program over a network such as the Internet or over a communication circuit such as a telephone circuit, and a medium for holding, in such a case, a program for a fixed period of time, such as a volatile memory within a computer system that functions as a server or a client. Furthermore, the program may be configured to implement some of the functions described above, and may also be configured to implement the functions described above in combination with a program already recorded in a computer system.

Furthermore, a part or the entire of the control device 21 according to the above-described embodiment may be implemented as an integrated circuit such as a large-scale integration (LSI), or the like. Functional blocks of the control device 21 may be individually implemented as processors, or a part or all thereof may be integrated and implemented as a processor. Furthermore, the technique for being implemented as an integrated circuit is not limited to the LSI, and the implementation with a dedicated circuit or a general-purpose processor is possible. Furthermore, in a case where advances in the semiconductor technology enable the implementation as an integrated circuit that can replace the LSI, such an advanced integrated circuit may be applicable.

Although the embodiment of the present invention has been described in detail with reference to the accompanying drawings, the detailed configuration is not limited to what has been described above, and various design modifications may be made without departing from the scope of the present invention.

What is claimed is:

1. A charged particle beam apparatus processing a sample by irradiating the sample with a charged particle beam, the charged particle beam apparatus comprising:
   an image identity degree determination unit determining whether an identity degree is equal to or greater than a predetermined value, the identity degree indicating a degree of identity between a processing cross-section image that is an SEM image obtained through observation of a cross section of the sample by a scanning electron microscope, and a criterion image;
   a post-determination processing unit performing a predetermined processing operation according to a result of the determination by the image identity degree determination unit;
   a registration image determination unit determining, based on the processing cross-section image, whether a particular structure appears on the cross section, in a period before the image identity degree determination unit performs the determination; and
   an image registration unit registering the processing cross-section image as the criterion image when the registration image determination unit determines that the particular structure appears on the cross section, in the period.

2. The charged particle beam apparatus of claim 1, wherein the registration image determination unit uses, as the processing cross-section image, the SEM image for the determination which is obtained through observation by the scanning electron microscope with use of a first mode, in the period;
   the image registration unit registers, as the criterion image, the processing cross-section image obtained through observation of the cross section by the scanning electron microscope with use of a second mode having resolution lower that resolution of the first mode, when the registration image determination unit determines that the particular structure appears on the cross section, in the period; and
   the image identity degree determination unit uses, as the processing cross-section image, the SEM image for the determination which is obtained through observation by the scanning electron microscope with use of the second mode.

3. The charged particle beam apparatus of claim 1, wherein the criterion image is a plurality of the processing cross-section images, and
   the image registration unit registers the processing cross-section image as the criterion image each time the registration image determination unit determines that the particular structure appears on the cross section, in the period.

4. The charged particle beam apparatus of claim 2, wherein the criterion image is a plurality of the processing cross-section images, and
   the image registration unit registers the processing cross-section image as the criterion image each time the registration image determination unit determines that the particular structure appears on the cross section, in the period.

5. The charged particle beam apparatus of claim 1, wherein the criterion image is the SEM image in which the particular structure is taken, and
   the predetermined processing operation is a processing operation in which a predetermined analysis is conducted.

6. The charged particle beam apparatus of claim 1, wherein the criterion image is the SEM image in which the particular structure is taken, and
   the predetermined processing operation is a processing operation in which a predetermined analysis is conducted.

7. The charged particle beam apparatus of claim 2, wherein the criterion image is the SEM image in which the particular structure is taken, and the predetermined processing operation is a processing operation in which a predetermined analysis is conducted.

8. The charged particle beam apparatus of claim 3, wherein the criterion image is the SEM image in which the particular structure is taken, and
the predetermined processing operation is a processing operation in which a predetermined analysis is conducted.

9. The charged particle beam apparatus of claim 4, wherein the criterion image is the SEM image in which the particular structure is taken, and
the predetermined processing operation is a processing operation in which a predetermined analysis is conducted.

10. A control method of a charged particle beam apparatus that processes a sample by irradiating the sample with a charged particle beam, the control method comprising:
a registration image determination process of determining, based on a processing cross-section image that is an SEM image obtained through observation of a cross section of the sample by a scanning electron microscope, whether a particular structure appears on the cross section;
an image registration process of registering the processing cross-section image as a criterion image when the registration image determination unit determines that the particular structure appears on the cross section;
an image identity degree determination process of whether an identity degree is equal to or greater than a predetermined value, the identity degree indicating a degree of identity between the processing cross-section image that is an SEM image obtained after the registration image determination process and the image registration process, and the criterion image that is previously registered by the image registration process; and
a post-determination processing operation process of performing a predetermined processing operation according to a result of the determination in the image identity degree determination process.

* * * * *